US006770879B1

(12) United States Patent
Azordegan et al.

(10) Patent No.: US 6,770,879 B1
(45) Date of Patent: Aug. 3, 2004

(54) MOTION PICTURE OUTPUT FROM ELECTRON MICROSCOPE

(75) Inventors: Amir Azordegan, Santa Clara, CA (US); Christopher Bevis, Los Gatos, CA (US); Bharat Marathe, Cupertino, CA (US); David R. Bakker, Cupertino, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/386,815

(22) Filed: Mar. 12, 2003

(51) Int. Cl.[7] ........................ H01J 37/256; H01J 37/28
(52) U.S. Cl. ...................................... 250/310; 250/307
(58) Field of Search ................................ 250/310, 307

(56) References Cited

U.S. PATENT DOCUMENTS 4,943,722 A * 7/1990 Breton et al. ............... 250/310
5,254,857 A * 10/1993 Ross et al. .................. 250/310
6,538,249 B1 * 3/2003 Takane et al. ............... 250/310

* cited by examiner

*Primary Examiner*—Jack I. Berman
(74) *Attorney, Agent, or Firm*—Luedeka, Neely & Graham, P.C.

(57) ABSTRACT

An apparatus for recording a series of images of a sample over a period of time while varying at least one image parameter. An electron microscope captures images of the sample and also varies the at least one image parameter. A controller triggers the electron microscope to sense multiple images of the sample and also controls the electron microscope to vary the at least one image parameter. An image recorder receives the sensed multiple images and also stores the sensed multiple images as the series of images. A display unit displays the series of images.

20 Claims, 1 Drawing Sheet

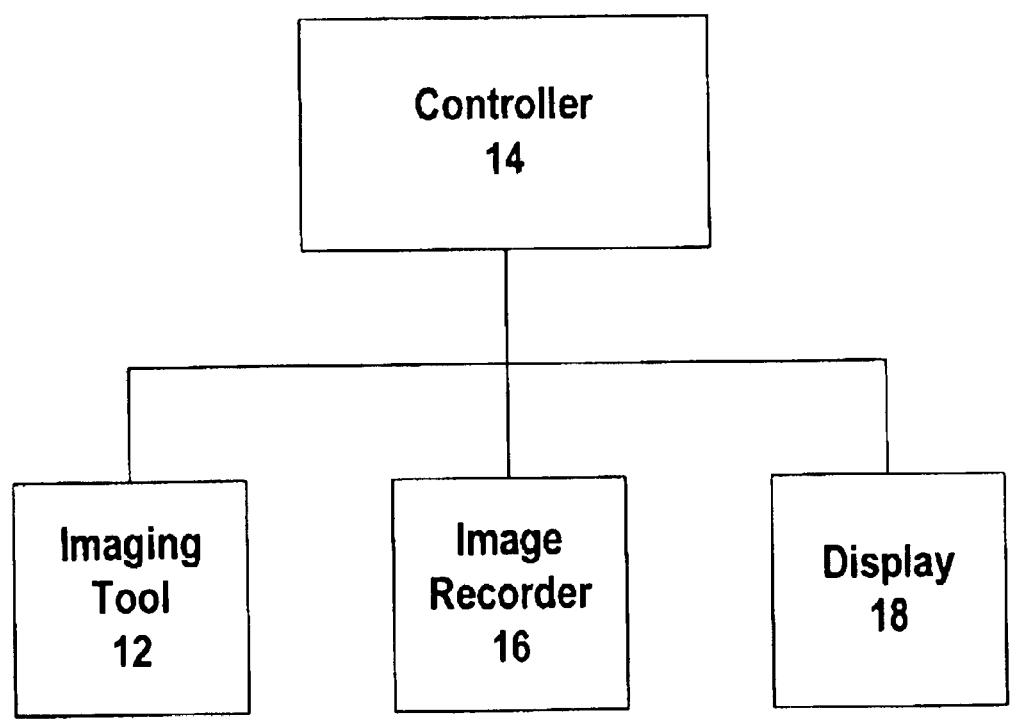

MOTION PICTURE OUTPUT FROM ELECTRON MICROSCOPE

FIELD

This invention relates to the field of instrumentation. More particularly, this invention relates to improved data output from an electron microscope.

BACKGROUND

In the integrated circuit industry, electron microscopes are used to review integrated circuit components for a variety of purposes, including critical dimensions and component defects. The quality of the finished integrated circuit tends to be highly dependent on the accurate detection of imperfections by the electron microscope. Thus, it is very important to ensure that the data received from the electron microscope is complete and useable.

Typically, an electron microscope creates a still image at a single set of parameters, such as landing energy, angle of incidence, zoom factor, position of sample, focal plane, and charge accumulation. A user reviews the image produced by the electron microscope to detect any imperfections in the integrated circuit components.

There are several disadvantages to the typical method. The data taken at a single set of conditions may not contain the desired data. For example, the image may not show a defect that is obscured from view at all but a narrow range of angles. Further, a two dimensional still image produced by the electron microscope does not allow for three dimensional reconstructions of the structures in the samples. Also, when data is stored for later use or communicated to other users, such other users often cannot determine what the imaged data is showing. Such users cannot zoom out to obtain a larger image, pan to other portions of the component, change the image's focal plane, or adjust the charge accumulation. Because it is often not possible to later recreate the image as it was taken with a specific set of parameters, the opportunity to detect certain defects or to otherwise adequately analyze the sample may be lost.

What is needed, therefore, is a system to improve the usability and completeness of data gathered from an electron microscope.

SUMMARY

The above and other needs are met by an apparatus for recording a series of images of a sample over a period of time while varying at least one image parameter. An electron microscope captures images of the sample and also varies the at least one image parameter. A controller triggers the electron microscope to sense multiple images of the sample over the period of time and also controls the electron microscope to vary the at least one image parameter over the period of time. An image recorder receives the sensed multiple images and also stores the sensed multiple images as the series of images. A display unit displays the series of images.

In this manner, the system described herein provides numerous advantages relating to the data output from an electron microscope. The system enables higher confidence in the accuracy and completeness of data and allows a user to locate defects that would be obscured from view at a small set of parameters. When the sample images are communicated to others or reviewed at a later time, the user will not have to recreate the data, because the desired information is contained in the series of images. Further, if a desired feature of the sample cannot be identified in one or more of the images in the series sensed at a given set of parameters, the system allows a user to view images from the series sensed at a different set of parameters, so that the desired feature is easier to identify. By varying the image parameters used in the sample images during the review, a user can obtain a more complete recreation of the reviewed area of the integrated circuit. This improved confidence and data usability enables more complete and accurate review of critical dimensions and defects, leading to higher yield in the manufacture of integrated circuits.

In various preferred embodiments, the imaging tool is an electron microscope, and most preferably a scanning electron microscope. The display of the series of images is preferably one of a motion picture in free running mode, a motion picture in manually controlled mode, a three dimensional reconstruction, and a simultaneous display at least a portion of the series of images as a super resolution image. The image parameters varied by the controller preferably include both imaging tool parameters and sample parameters. Imaging tool parameters include those parameters which affect the imaging tool, such as landing energy, zoom factor, focal plane, energy filter setting, angle of incidence by changing the beam angle, and charge accumulation. Sample parameters include those parameters which affect the sample, such as angle of incidence by changing the sample angle, and position of sample.

BRIEF DESCRIPTION OF THE DRAWINGS

Further advantages of the invention are apparent by reference to the detailed description when considered in conjunction with the figure, which is not to scale so as to more clearly show the details, and which depicts a functional block diagram of a preferred embodiment of an apparatus according to the invention, including an imaging tool, controller, image recorder, and display unit.

DETAILED DESCRIPTION

Referring now to the figure, there is shown a functional block diagram of a preferred embodiment of an apparatus 10 according to the present invention, including an imaging tool 12, controller 14, image recorder 16, and display unit 18. The imaging tool 12 is preferably an electron microscope, and most preferably a scanning electron microscope, but may alternately be an x-ray detection system or an optical microscope detection system. The imaging tool 12, and the equipment and methods described below in regard to its use, is preferably used for one or more purposes such as defect review, inspection, and metrology, to all of which the system described herein applies.

A user positions a sample in the imaging tool 12 so that the imaging tool 12 can sense the integrated circuit to be reviewed. It is appreciated that the examples described herein are in regard to integrated circuits, but that the system 10 as described herein is useful for other sample types as well. The controller 14 instructs the imaging tool 12 to sense a series of images of the integrated circuit, while also instructing the imaging tool 12 to vary over time the image parameters used by the imaging tool 12. Thus, one or more image parameters are varied to create a series of images. The images may include a large area around the reviewed location, so that features that were not of initial interest can be viewed at a later-point in time. Alternately, multiple image parameters may be varied to further enhance the information content of the series of images.

The varying of the image parameters and the sensing of the series of images may occur either over a period of time or simultaneously. It is appreciated that if an image parameter such as sample position is sensed at multiple levels simultaneously, then multiple sensors on the imaging tool are preferably used.

The image parameters varied by the controller 14 preferably include both imaging tool parameters and sample parameters. Imaging tool parameters include those parameters which affect the imaging tool 12, such as landing energy, zoom factor, focal plane, energy filter setting, angle of incidence by changing the beam angle, and charge accumulation. Sample parameters include those parameters which affect the sample, such as angle of incidence by changing the sample angle, and position of sample, such as at least one of x, y, z, and rotation. The controller 14 is preferably programmable to vary either imaging tool parameters or sample parameters or both, and to vary such parameters in either a manual mode, where the operator makes real time adjustments to the parameters, or an automated mode, where the controller 14 varies the parameters according to a preprogrammed recipe or script.

The controller 14 in one embodiment captures a series of images for each of the various sites investigated, which series of images are used to create a three dimensional reconstruction for subsequent review of the image data. For example, the tilt on an electron microscope may be used to record a series of images of the integrated circuit while moving an effective viewing point in an orbital fashion over the field of view. This allows clear viewing of the three dimensional structure and of features which would have been obscured in all but a small range of angles. The selection of sites at which a series of images is collected could also be made by a statistical method based on classification of defects.

The series of images triggered for capture by the controller 14 are delivered to and recorded by an image recorder 16, such as a diskette, compact disc, computer memory, or video tape. The stored series of images is retrieved from the image recorder 16 and displayed on a display unit 18, such as a computer monitor. The display unit 18 may display the series of images as a motion picture. This motion picture may be free running, meaning that the user reviewing the images views the entire series of images. Alternately, the motion picture may be controlled manually, in which the user selects a set of viewing parameters, as if the user was operating the imaging tool 12 in real time, and the controller 14 provides for the sequential display of just those images in which the selected viewing parameters are varied. The user may thus vary the image parameters to find the associated images among the series of images that allow for the best review and identification of the feature of interest. The user may zoom out from an image using the zoom factor or pan to another image of the reviewed area of the integrated circuit.

Alternately, a series of images taken from a variety of angles is composited and displayed by the display unit 18 in a single image as a three dimensional reconstruction of the structures in the integrated circuit. At least a portion of the series of images may also be composited and displayed simultaneously on the display unit 16 to form a super resolution image.

The system 10 is in one embodiment configured as an add-on controller 14 to an existing imaging tool 12, using an existing image recorder 16 and display unit 18.

The system described herein provides numerous advantages relating to the data output from an imaging tool. The system enables higher confidence in the accuracy and completeness of data. The system allows a user to locate defects that would be obscured from view at a small set of parameters. When the sample images are communicated to others or reviewed at a later time, the user will not have to attempt to recreate the data if required information is not contained in the image. Further, if the captured image cannot be identified, the system allows a user to change the parameters of the image so that the sample is easier to identify. By varying the image parameters of the images during the review, a user can obtain a more complete recreation of the reviewed area of the integrated circuit. This improved confidence and data usability enables more complete and accurate review of critical dimensions and defects, leading to higher yield in the manufacture of integrated circuits.

One of the many benefits of the present invention is in the use of the controller 14 to direct the capture of a great number of correlated images. Typically a SEM operator may locate a feature of interest and view a single image of the feature. If it is later decided that the image does not contain the desired information in regard to that feature, then the sample must be reloaded into the SEM and a further investigation conducted. However, in the present invention the controller 14 can be programmed to capture many images in an automated fashion, thus freeing the operator from having to decide what images should be viewed.

For example, a plurality of recipes for the controller can be developed by an engineer, which recipes are adapted for the investigation of one or more different types of events. A recipe could be specifically written for a specific defect type or for a given critical dimension evaluation. Each recipe can direct for the variance of selected imaging parameters in a given combination and manner over a given period of time. The operator simply loads the sample into the imaging tool 12, and sets the controller 14 for the appropriate recipe. The controller 14 then controls the imaging tool 12 according to the recipe, such as by recording a series of images that pan across the area of interest, zoom in and out of the area of interest, change the angle of investigation, rotate about the area of interest, change the charge, energy, or focus, or change more than one of these parameters at a time. All of the images are preferably captured without any further required intervention by the operator, who merely removes the sample at the end of the recipe. The images are preferably stored with associated meta data, in which the values of the imaging parameters associated with the images are recorded, so that images from the series can be retrieved at a later point in time, based at least in part upon their associated imaging parameters.

At some later point in time an engineer can call up the series of images that have been stored, such as on a computer readable media on a network, and using specialized software can investigate the sample using controls that correspond to those on the imaging tool 12, such as zoom, pan, focus, angle, and so forth. As the engineer adjusts the software controls, the appropriate images corresponding to the parameters selected by the engineer are presented on a display. Thus, it is as though the engineer is himself sitting at the controls of the imaging tool 12, making the adjustments to the images that the operator may have not known were desired or necessary. The controller 12 is preferably implemented in software on a personal computer having the interfaces necessary to control the imaging tool 14. The playback controller as described above may also be implemented within the controller 12, or may be a stand alone piece of software that also runs on a computer platform, such as a personal computer.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical applications, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An apparatus for recording images of a sample over a period of time while varying at least one image parameter, the apparatus comprising:

an electron microscope adapted for sensing the images of the sample and also adapted for varying the at least one image parameter, a controller adapted for triggering the electron microscope to sense the images of the sample over the period of time, controlling the electron microscope to vary the at least one image parameter over the period of time, and associating given values of the at least one image parameter with the images at a time when each image is sensed, a recorder adapted for recording the sensed images and the associated given values of the at least one parameter, an input adapted for receiving desired viewing values of the at least one image parameter, and a display unit adapted for displaying the image in a sequence based upon the desired viewing values, as retrieved from the recorder based upon the association between the given values of the at least one image parameter and the images at the time when each image was sensed, as though operating the electron microscope in real time.

2. The apparatus of claim 1, wherein the electron microscope is a scanning electron microscope.

3. The apparatus of claim 1, wherein the at least one image parameter varied by the controller includes imaging tool parameters.

4. The apparatus of claim 1, wherein the controller varies the at least one image parameter according to a predefined recipe.

5. The apparatus of claim 1, wherein the display unit is adapted to display the images as a three dimensional reconstruction.

6. The apparatus of claim 1, wherein the display unit is adapted to simultaneously display at least a portion of the images as a super resolution image.

7. The apparatus of claim 1, wherein the at least one image parameter is at least one of landing energy, angle of incidence, zoom factor, position of sample, focal plane, energy filter setting, and charge accumulation.

8. An apparatus for recording images of a sample while varying a least one image parameter, the apparatus comprising:

a controller adapted for triggering an imaging tool to sense the images of the sample, controlling the imaging tool to vary the at least one image parameter, and associating given values of the at least one image parameter with the images at a time when each image is sensed, a recorder adapted for recording the sensed images and the associated given values of the at least one parameter, an input adapted for receiving desired viewing values of the at least one image parameter, and an output adapted for providing the images to a display unit in a sequence based upon the desired viewing values, as retrieved from the recorder based upon the association between the given values of the at least one image parameter and the images at the time when each image was sensed, as though operating the imaging tool in real time.

9. The apparatus of claim 8, further comprising a display unit adapted to display the images.

10. The apparatus of claim 9, wherein the are retrieved in a free running mode.

11. The apparatus of claim 9, wherein the images are retrieved in a manually controlled mode.

12. The apparatus of claim 9, wherein the display unit is adapted to display the images as a three dimensional reconstruction.

13. The apparatus of claim 9, wherein the display unit is adapted to simultaneously display at least a portion of the images as a super resolution image.

14. The apparatus of claim 8, wherein the imaging tool is an electron microscope.

15. The apparatus of claim 8, wherein the controller is adapted to trigger the imaging tool to sense the images simultaneously.

16. A method for recording images of a sample over a period of time while varying at least one image parameter, the method comprising the steps of:

sensing an image of the sample using an imaging tool at a given value of the at least one image parameter, associating the sensed image with the given value of the at least one image parameter, selectively varying the at least one image parameter, selectively repeating the steps of sensing the image, associating the sensed image with the given value, and selectively varying the at least one image parameter during the period of time, storing the sensed images and the associated given value of the at least one image parameter, receiving desired viewing values of the at least one image parameter, and displaying the stored images in a sequence based upon the desired viewing values, based upon the association between the given value of the at least one image parameter and the sensed image when each image was sensed, as though operating the imaging tool in real time.

17. The method of claim 16, wherein the imaging tool is a scanning electron microscope.

18. The method of claim 16, wherein the images are displayed as a three dimensional construction.

19. The method of claim 16, wherein the images are displayed simultaneously as a super resolution image.

20. The method of claim 16, wherein the at least one image parameter includes at least one of landing energy, angle of incidence, zoom factor, position of sample, focal plane, energy filter setting and charge accumulation.

* * * * *